US009606442B2

(12) United States Patent
Mathijssen et al.

(10) Patent No.: US 9,606,442 B2
(45) Date of Patent: Mar. 28, 2017

(54) POSITION MEASURING APPARATUS, POSITION MEASURING METHOD, LITHOGRAPHIC APPARATUS AND DEVICE MANUFACTURING METHOD

(71) Applicant: ASML Netherlands B.V., Veldhoven (NL)

(72) Inventors: Simon Gijsbert Josephus Mathijssen, Den Bosch (NL); Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 138 days.

(21) Appl. No.: 14/418,373

(22) PCT Filed: Jul. 16, 2013

(86) PCT No.: PCT/EP2013/064982
§ 371 (c)(1),
(2) Date: Jan. 29, 2015

(87) PCT Pub. No.: WO2014/019846
PCT Pub. Date: Feb. 6, 2014

(65) Prior Publication Data
US 2015/0261097 A1    Sep. 17, 2015

Related U.S. Application Data

(60) Provisional application No. 61/677,265, filed on Jul. 30, 2012.

(51) Int. Cl.
*G03F 7/20* (2006.01)
*G03F 9/00* (2006.01)

(52) U.S. Cl.
CPC ........ *G03F 7/70141* (2013.01); *G03F 9/7026* (2013.01); *G03F 9/7034* (2013.01)

(58) Field of Classification Search
None
See application file for complete search history.

(56) References Cited

U.S. PATENT DOCUMENTS 5,783,833 A * 7/1998 Sugaya ............... G03F 9/70
250/548
6,476,382 B1  11/2002 Zhai et al.
(Continued)

FOREIGN PATENT DOCUMENTS

CN     102540778 A   4/2012
EP       2458441 A2   5/2012
(Continued)

OTHER PUBLICATIONS

English-Language Abstract for Application No. JP S59-174707 A, published Oct. 3, 1984; 2 pages.
(Continued)

*Primary Examiner* — Steven H Whitesell Gordon
(74) *Attorney, Agent, or Firm* — Sterne, Kessler, Goldstein & Fox P.L.L.C.

(57) ABSTRACT

An apparatus for measuring positions of marks on a substrate, includes an illumination arrangement for supplying radiation with a predetermined illumination profile across a pupil of the apparatus, an objective lens for forming a spot of radiation on a mark using radiation supplied by said illumination arrangement, a radiation processing element for processing radiation that is diffracted by the mark, a first detection arrangement for detecting variations in an intensity of radiation output by the radiation processing element and for calculating therefrom a position of the mark, an optical arrangement, a second detection arrangement, wherein the optical arrangement serves to direct diffracted radiation to the second detection arrangement, and wherein the second detection arrangement is configured to detect size and/or (Continued)

position variations in the radiation and to calculate therefrom a defocus and/or local tilt of the mark.

17 Claims, 8 Drawing Sheets

(56) References Cited

U.S. PATENT DOCUMENTS

| | | | |
|---|---|---|---|
| 6,961,116 B2* | 11/2005 | Den Boef | G03B 27/32 355/53 |
| 8,593,646 B2 | 11/2013 | Den Boef et al. | |
| 2008/0088843 A1 | 4/2008 | Shibazaki | |
| 2009/0097008 A1 | 4/2009 | Mos et al. | |
| 2009/0195768 A1 | 8/2009 | Bijnen et al. | |
| 2009/0201514 A1* | 8/2009 | Sato | G03F 9/7026 356/624 |
| 2010/0201963 A1* | 8/2010 | Cramer | G01J 3/18 355/67 |
| 2011/0013165 A1 | 1/2011 | Kaneko et al. | |
| 2011/0013188 A1 | 1/2011 | Slotboom et al. | |
| 2011/0027704 A1 | 2/2011 | Cramer et al. | |
| 2011/0134416 A1 | 6/2011 | Ke et al. | |

FOREIGN PATENT DOCUMENTS

| | | |
|---|---|---|
| JP | S59-174707 A | 10/1984 |
| JP | H05-107042 A | 4/1993 |
| JP | 2001-091211 A | 4/2001 |
| JP | 2009-094512 A | 4/2009 |
| WO | WO 2011/104178 A1 | 9/2011 |

OTHER PUBLICATIONS

English-Language Abstract for Application No. JPH05-107042 A published Apr. 27, 1993; 1 page.
English-Language Abstract for Application No. JP 2001-091211 A, published Apr. 6, 2001; 2 pages.
English-Language Abstract for Chinese Patent Publication No. 102540778, published Jul. 4, 2012; 1 page.
International Search Report directed to related International Patent Application No. PCT/EP2013/064982, mailed Mar. 28, 2014; 3 pages.
International Preliminary Report on Patentability and Written Opinion of the International Searching Authority directed to related International Patent Application No. PCT/EP2013/064982, issued Feb. 3, 2015; 5 pages.

* cited by examiner

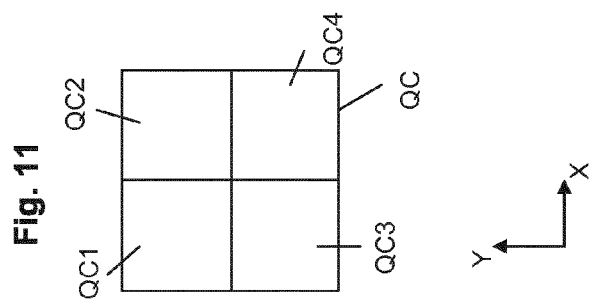
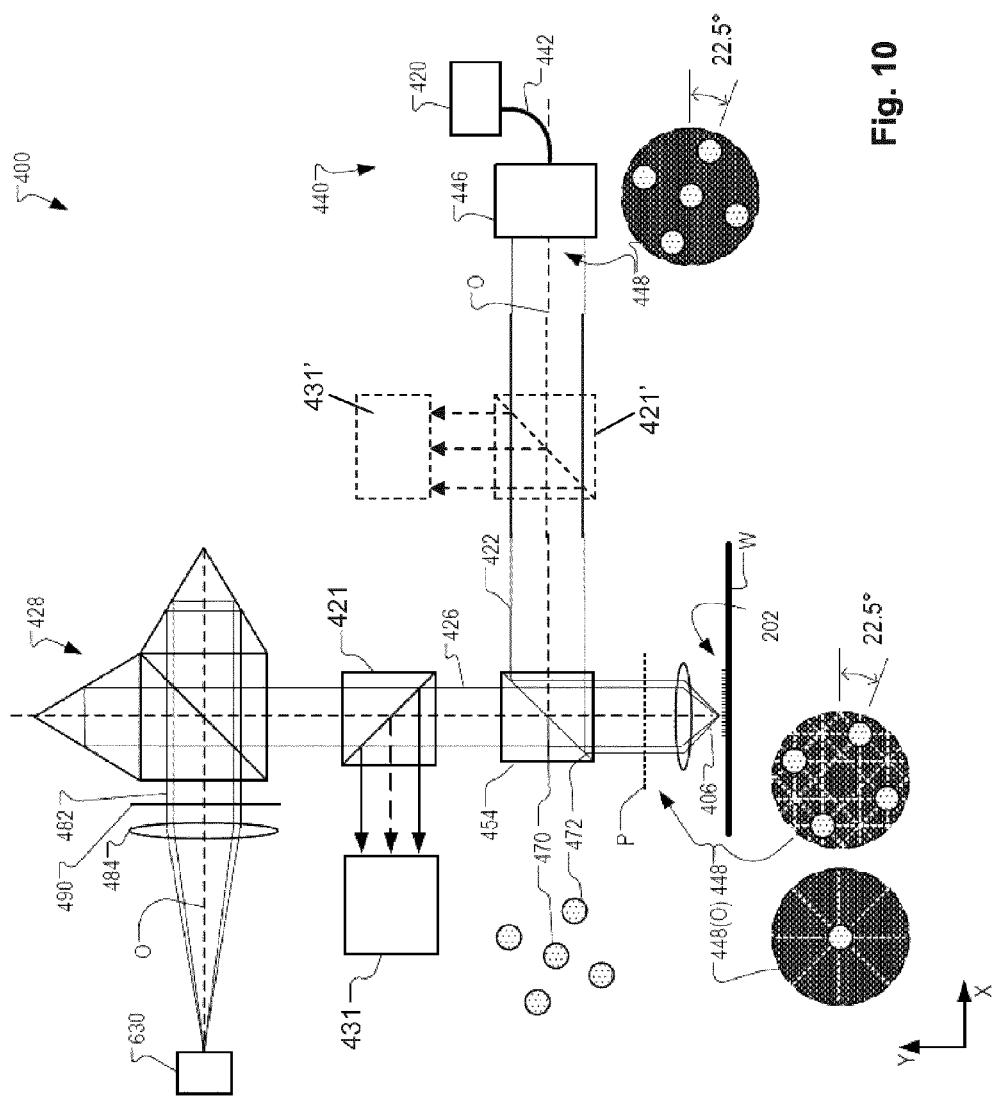

POSITION MEASURING APPARATUS, POSITION MEASURING METHOD, LITHOGRAPHIC APPARATUS AND DEVICE MANUFACTURING METHOD

CROSS-REFERENCE TO RELATED APPLICATIONS

This application claims the benefit of U.S. provisional application 61/677,265, which was filed on Jul. 30, 2012, and which is incorporated herein in its entirety by reference.

FIELD

The present invention relates to position measurement method and apparatus. The method and apparatus can be used for measuring the positions of marks on a substrate. The invention in other aspects provides a lithographic apparatus and device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, alignment marks are generally provided on the substrate, and the lithographic apparatus includes one or more alignment sensors by which positions of marks on a substrate should be measured accurately. These alignment sensors are effectively position measuring apparatuses. Different types of marks and different types of alignment sensors are known from different times and different manufacturers. A type of sensor widely used in current lithographic apparatus is based on a self-referencing interferometer as described in U.S. Pat. No. 6,961,116 (den Boef et al). Generally marks are measured separately to obtain X- and Y-positions. A combined X- and Y-measurement can be performed using the techniques described in published patent application US 2009/195768 A (Bijnen et al), however. The contents of both of these applications are incorporated herein by reference.

There is continually a need to provide more accurate position measurements, especially to control overlay error as product features get smaller and smaller. For this purpose, it is considered to increase the numerical aperture of the alignment sensors. However, by doing this the sensors become more sensitive to defocus and local tilt of the substrate, which can lead to an apparent position deviation (APD) and color to color variations when radiation with multiple wavelengths are used. The separate level sensors currently used to move the substrate into focus of the alignment sensors are not able to detect the defocus and local tilt of the substrate to such an extent that the increased sensitivity can be compensated for, because the alignment marks are usually buried underneath a relatively thick stack of layers, while the level sensors are designed to probe the top of the stack of layers.

SUMMARY

It is an aim of the invention to provide a position measurement apparatus, for example an alignment sensor in a lithographic apparatus, having the possibility to measure the defocus and/or local tilt of a substrate.

According to an embodiment of the invention, there is provided an apparatus for measuring positions of marks on a substrate, the apparatus comprising:

an illumination arrangement for supplying radiation with a predetermined illumination profile across a pupil of the apparatus;

an objective lens for forming a spot of radiation on a mark using radiation supplied by said illumination arrangement while scanning said spot of radiation across the mark in a scanning direction;

a radiation processing element for processing radiation that is diffracted by the mark and received by said objective lens;

a first detection arrangement for detecting variations in an intensity of radiation output by the radiation processing element during said scanning and for calculating from the detected variations a position of the mark in at least a first direction of measurement, an optical arrangement;

a second detection arrangement;

wherein the optical arrangement serves to direct radiation that is diffracted by the mark to the second detection arrangement, and wherein the second detection arrangement is configured to detect size and/or position variations in the radiation output by the optical arrangement and to calculate from the detected variations a defocus and/or local tilt of the mark.

According to another embodiment of the invention, there is provided a method for measuring a position of a mark on a substrate, the mark comprising features periodic in at least a first direction, the method comprising:

illuminating the mark with a spot of radiation via an objective lens and receiving radiation diffracted by the mark via the same objective lens;

processing the diffracted radiation in a radiation processing element;

detecting first variations in an intensity of radiation output by the radiation processing element while scanning the mark with the spot of radiation;

calculating from the detected first variations a position of the mark in at least a first direction of measurement, detecting second variations in size and/or position of radiation diffracted by said mark; and calculating from the detected second variations a defocus and/or local tilt of the mark.

According to yet another embodiment of the invention, there is provided a lithographic apparatus arranged to transfer a pattern from a patterning device onto a substrate, the apparatus comprising a substrate table constructed to hold a substrate and an alignment sensor for measuring the positions of marks on the substrate relative to a reference frame of the lithographic apparatus, wherein the alignment sensor comprises a measuring apparatus according to the invention, and wherein the lithographic apparatus is arranged to control the transfer of a pattern onto the substrate by reference to the positions of marks on the substrate measured using said measuring apparatus.

According to a further embodiment of the invention, there is provided a method of manufacturing a device in which a lithographic process is used to transfer a pattern from a patterning device onto a substrate, and wherein the transfer of a pattern onto the substrate is controlled by reference to positions of marks on the substrate measured using a method according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2(a) and FIG. 2(b), illustrates various forms of an alignment mark that may be provided on a substrate in the apparatus of FIG. 1;

FIG. 9, comprising

FIG. 10 is a schematic diagram of a position measuring apparatus according to the invention implementing off-axis illumination; hand.

FIG. 11 depicts a front view of a multi-element photodiodes suitable for measuring the position of diffracted radiation.

DETAILED DESCRIPTION

Figure 1:
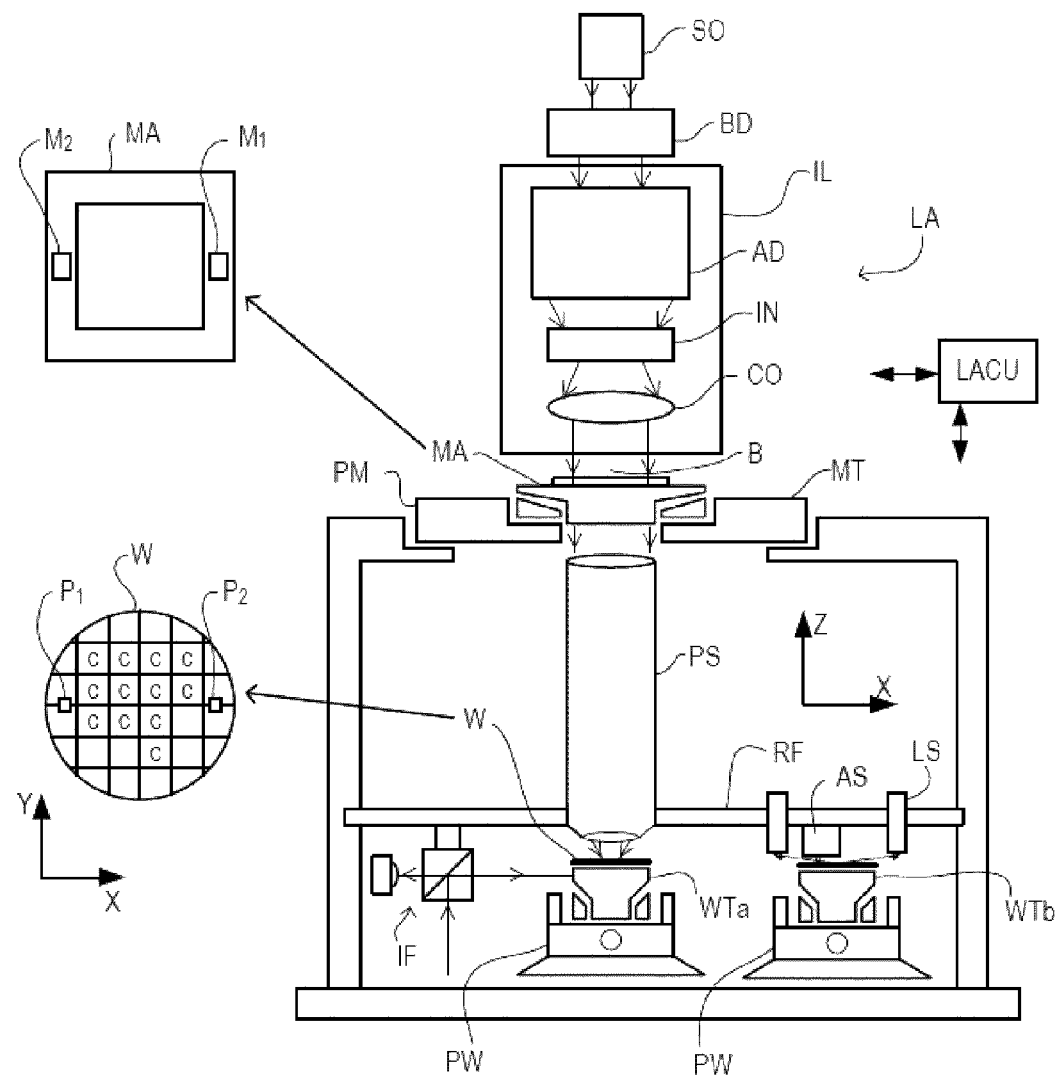
FIG. 1 depicts an exemplary lithographic apparatus including an alignment sensor forming measuring apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
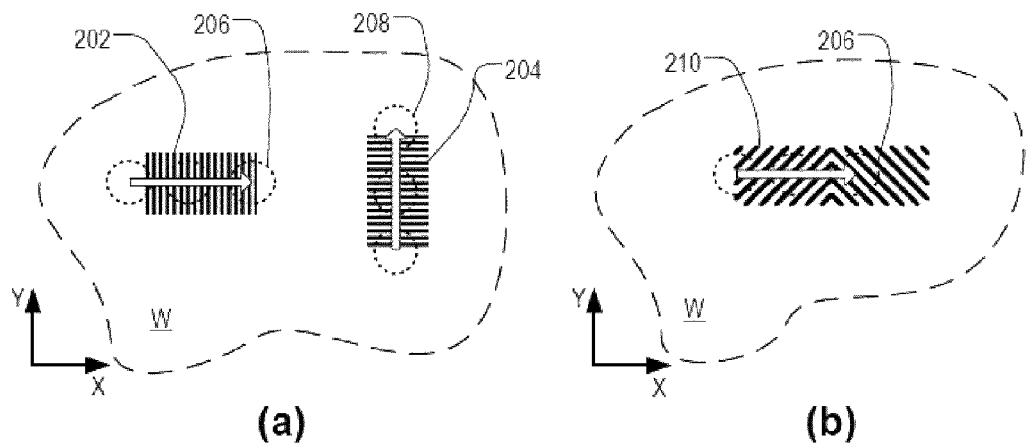
FIG. 2, comprising

FIG. 2(a) shows examples of alignment marks 202, 204, provided on substrate W for the measurement of X-position and Y-position, respectively. Each mark in this example comprises a series of bars formed in a product layer or other layer applied to or etched into the substrate. The bars are regularly spaced and act as grating lines so that the mark can be regarded as a diffraction grating with a well-known spatial period (pitch). The bars on the X-direction mark 202 are parallel to the Y-axis to provide periodicity in the X direction, while the bars of the Y-direction mark 204 are parallel to the X-axis to provide periodicity in the Y direction. The alignment sensor AS (shown in FIG. 1) scans each mark optically with a spot 206, 208 of radiation, to obtain a periodically-varying signal, such as a sine wave. The phase of this signal is analyzed, to measure the position of the mark, and hence of substrate W, relative to the alignment sensor, which in turn is fixed relative to the reference frame RF of the apparatus. The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment sensor AS uses a wavelength of radiation (or usually plural wavelengths) much longer than the exposure radiation to be used for applying patterns to the substrate. Fine position information can be obtained, however, because the large number of bars allows the phase of a repeating signal to be accurately measured.

Coarse and fine marks may be provided, so that the alignment sensor can distinguish between different cycles of the periodic signal, as well as the exact position (phase) within a cycle. Marks of different pitches can also be used for this purpose. These techniques are again well known to the person skilled in the art, and will not be detailed herein. The design and operation of such sensors is well known in the art, and each lithographic apparatus may have its own design of sensor. For the purpose of the present description, it will be assumed that the alignment sensor AS is generally of the form described in U.S. Pat. No. 6,961,116 (den Boef et al). FIG. 2(b) shows a modified mark for use with a similar alignment system, which X- and Y-positions can be obtained through a single optical scan with the illumination spot 206. The mark 210 has bars arranged at 45 degrees to both the X- and Y-axes. This combined X- and Y-measurement can be performed using the techniques described in published patent application US 2009/195768 A (Bijnen et al), the contents of which are incorporated herein by reference.

Figure 3:
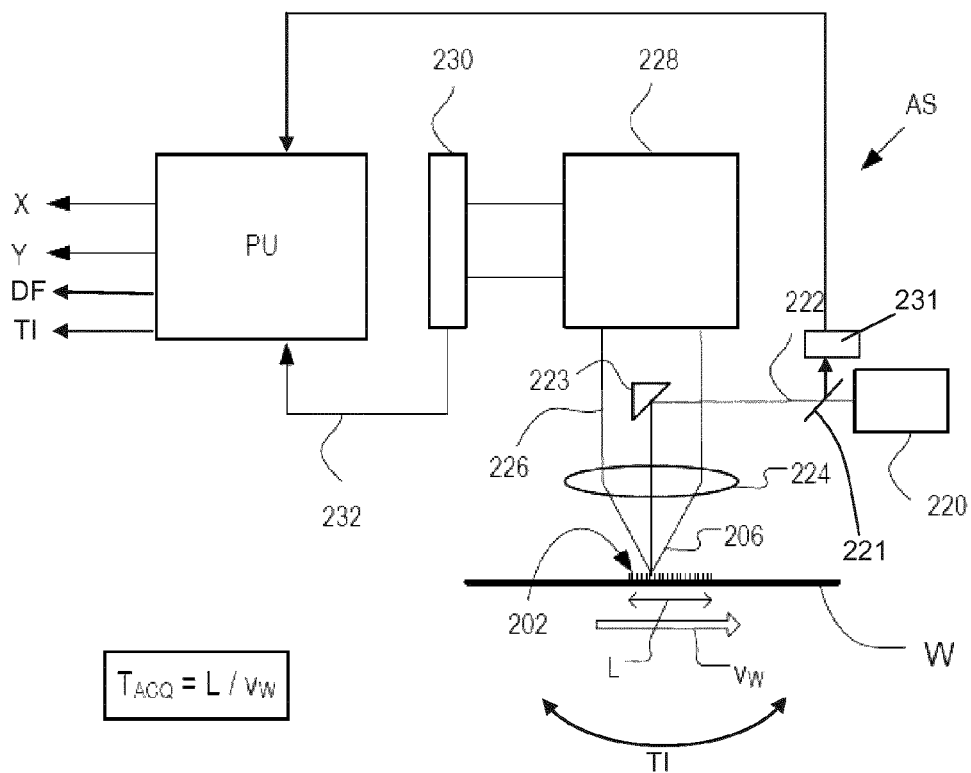
FIG. 3 is a schematic block diagram of an alignment sensor according to an embodiment of the invention scanning an alignment mark in the apparatus of FIG. 1.

FIG. 3 is a schematic block diagram of an alignment sensor AS according to an embodiment of the invention. Illumination source 220 provides a beam 222 of radiation of one of more wavelengths, which is diverted by a spot mirror 223 through an objective lens 224 onto a mark, such as mark 202, located on substrate W. As indicated schematically in FIG. 2, in the example of the present alignment sensor based on U.S. Pat. No. 6,961,116, mentioned above, the illumination spot 206 by which the mark 202 is illuminated may be slightly smaller in diameter then the width of the mark itself.

Radiation scattered, i.e. diffracted, by mark 202 is picked up by objective lens 224 and collimated into an information-carrying beam 226. A radiation processing element, in this embodiment a self-referencing interferometer 228 of the type disclosed in US' 116, mentioned above, processes beam 226 and outputs separate beams onto a sensor array 230. Spot mirror 223 not only serves to divert radiation from the illumination source into the objective lens, but also serves to direct a zero order signal of radiation diffracted by the mark back towards the illumination source, thereby causing the information carrying beam 226 to comprise only higher order signals of the radiation diffracted by the mark 202. Intensity signals 232 from individual sensors in sensor grid 230 are provided to a processing unit PU. By a combination of the optical processing in the block 228 and the computational processing in the unit PU, values for X- and Y-position on the substrate relative to the reference frame RF are output. Between the illumination source 220 and spot mirror 223, an optical element, in this case a beam splitter 221, is provided, which allows the transmission of beam 222 towards the spot mirror 223, but reflects radiation coming from the spot mirror after diffraction by the mark on the substrate to a second detection arrangement 231 configured to detect size and/or position variations in the radiation output by the beam splitter 221. The detected variations can be used by the processing unit PU to calculate a defocus DF and/or local tilt TI of the mark 202. Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

As mentioned already, a single measurement of the type illustrated only fixes the position of the mark within a certain range corresponding to one pitch of the mark. Coarser measurement techniques are used in conjunction with this to identify which period of the sine wave is the one containing the marked position. The same process at coarse and/or fine level can be repeated at different wavelengths for increased accuracy, and for robust detection of the mark irrespective of the materials from which the mark is made, and on which it sits. The wavelengths can be multiplexed and demultiplexed optically so as to be processed simultaneously, and/or they may be multiplexed by time division or frequency division. Examples in the present disclosure will refer to one measurement at one wavelength only, and the skilled reader can readily appreciate the modifications involved in expanding that teaching to provide a practical and robust measurement apparatus (alignment sensor).

Referring to the measurement process in more detail, an arrow labeled $v_W$ in FIG. 3 illustrates a scanning velocity with which spot 206 traverses the length L of mark 202. In this example, the alignment sensor AS and spot 206 in reality remain stationary, while it is the substrate W that moves with velocity $v_W$. The alignment sensor can thus be mounted rigidly and accurately to the reference frame RF (FIG. 1), while effectively scanning the mark 202 in a direction opposite to the direction of movement of substrate W. The substrate is controlled in this movement by its mounting on the substrate table WT and the substrate positioning system PW.

As discussed in the prior patent application U.S. Ser. No. 13/369,614, not published at the present priority date, the high productivity requirements required of the lithographic apparatus require the measurement of the alignment marks at numerous positions on the substrate to be performed as quickly as possible, which implies that the scanning velocity $v_W$ is fast, and the time $T_{ACQ}$ available for acquisition of each mark position is correspondingly short. In simplistic terms, the formula $T_{ACQ}=L/v_W$ applies. The prior application U.S. Ser. No. 13/369,614 describes a technique to impart an opposite scanning motion of the spot, so as to lengthen the acquisition time. The same scanning spot techniques can be applied in sensors and methods of the type newly disclosed herein, if desired.

Figure 4A:
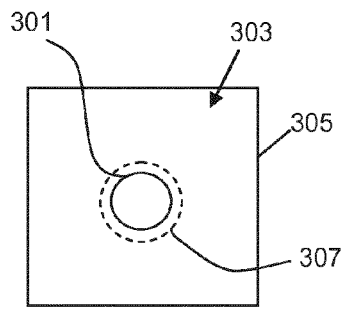
FIGS. 4A and 4B depict images of diffracted radiation on the second detection arrangement of FIG. 3 in different defocus and tilt situations.
Figure 4B:
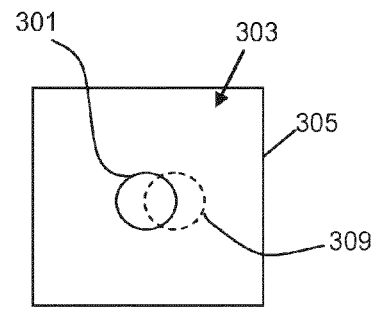

FIG. 4A and FIG. 4B both show an image 301 of a zero order signal of diffracted radiation on a detector surface 303 of detector 305 of the second detection arrangement 231 of FIG. 3 when the mark is in focus of the alignment sensor and when the mark has zero tilt with respect to the desired orientation of the mark relative to the alignment sensor.

FIG. 4A also shows an image 307 in case of defocus which means that the mark is out of focus. Compared to image 301, image 307 is increased in size, which can be measured if the detector 305 is capable of image size determination, e.g. by determining the amount of sensor pixels that receive a certain amount of radiation. By determining the size of the image on the detector, the amount of defocus can be determined. The detector 305 may thus be CCD camera or a similar device.

FIG. 4B also shows an image 309 when the mark is tilted relative to the desired orientation of image 301. Due to the tilting of the mark, the image has shifted position, wherein the amount of shift is representative for the amount of tilt.

Hence, for the embodiment of FIG. 3, the defocus and tilt can be determined by determining the image size and image position of the zero order signal respectively. In a similar fashion, the second detection arrangement can measure the image size and image position of higher order signals of the diffracted radiation to determine the defocus and tilt when a higher order signal is directed to the second detection arrangement instead of the zero order signal.

Figure 5:
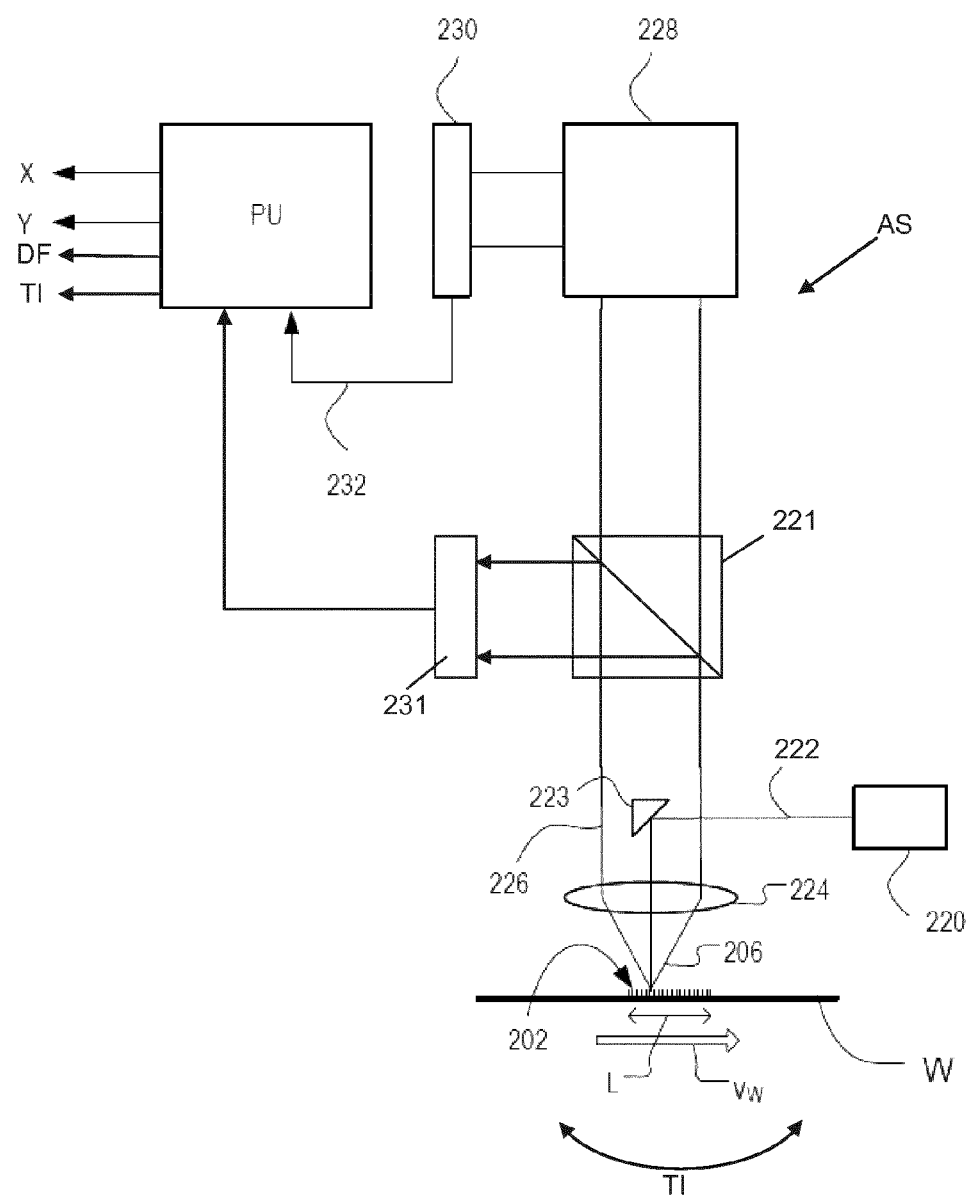
FIG. 5 is a schematic block diagram of an alignment sensor according to another embodiment of the invention scanning an alignment mark in the apparatus of FIG. 1.

FIG. 5 depicts a portion of a similar embodiment as the embodiment shown in FIG. 3, wherein the location of the beam splitter 221 and second detection arrangement 231 is different. Spot mirror 223 has a size which closely matches the size of the beam 222 from the illumination source 220. As a result thereof, any defocus or tilt will cause the zero order signal of radiation diffracted by the mark to partially pass the spot mirror to be part of the information carrying beam 226. The beam splitter 221 is in the embodiment of FIG. 5 located between the objective lens 224 and the interferometer 228 and directs a portion of the information carrying beam including zero order signal towards the second detection arrangement 231. The second detection arrangement 231 may be configured to ignore all higher order signals and to detect size and position variations in the zero order signal output by the beam splitter.

Figure 6A:
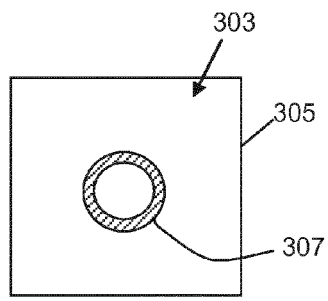
FIGS. 6A and 6B images of diffracted radiation on the second detection arrangement of FIG. 5 in different defocus and tilt situations.

FIG. 6A depicts an image 307 in case of defocus when using the zero order signal of the diffracted radiation. When the mark is in focus, the entire zero order signal will be stopped by spot mirror 223, so that the detection arrangement 231 will not detect any radiation. When the mark is out of focus, the size of the zero order signal will increase and a portion of the beam will pass the spot mirror as indicated by image 307. By determining the size of the image, the amount of defocus can be determined.

Figure 6B:
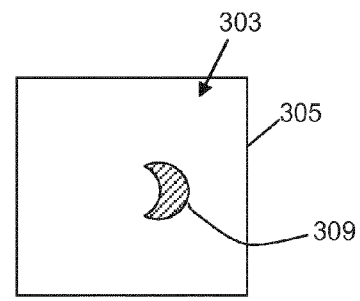

FIG. 6B depicts an image 309 in case of tilt of the mark when using the zero order signal. When the mark is in the desired orientation, the entire zero order signal will be stopped by spot mirror 203, so that the detection arrangement 231 will not detect any radiation. When the mark is tilted, the trajectory of the zero order signal is also tilted and a portion of the zero order signal will fall of the spot mirror and pass the spot mirror as indicated by image 309. By determining the shift of the zero order signal from the image 309, the tilt of the mark can be determined.

As mentioned above, the embodiment according to FIG. 5 ignores all higher order signals of the radiation diffracted by the mark. However, the invention is not limited to the use of the zero order signal. The second detection arrangement may thus well make use of one or more of the higher order signals to determine defocus and/or tilt while ignoring all other signals as long as the signal strength of the used higher order signal(s) is sufficient for detection purposes. As the higher order signals all pass the spot mirror 223, the detection principles of FIGS. 4A and 4B may be applied to these higher order signals instead of the detection principles of the zero order signal according to FIGS. 6A and 6B.

Figure 7:
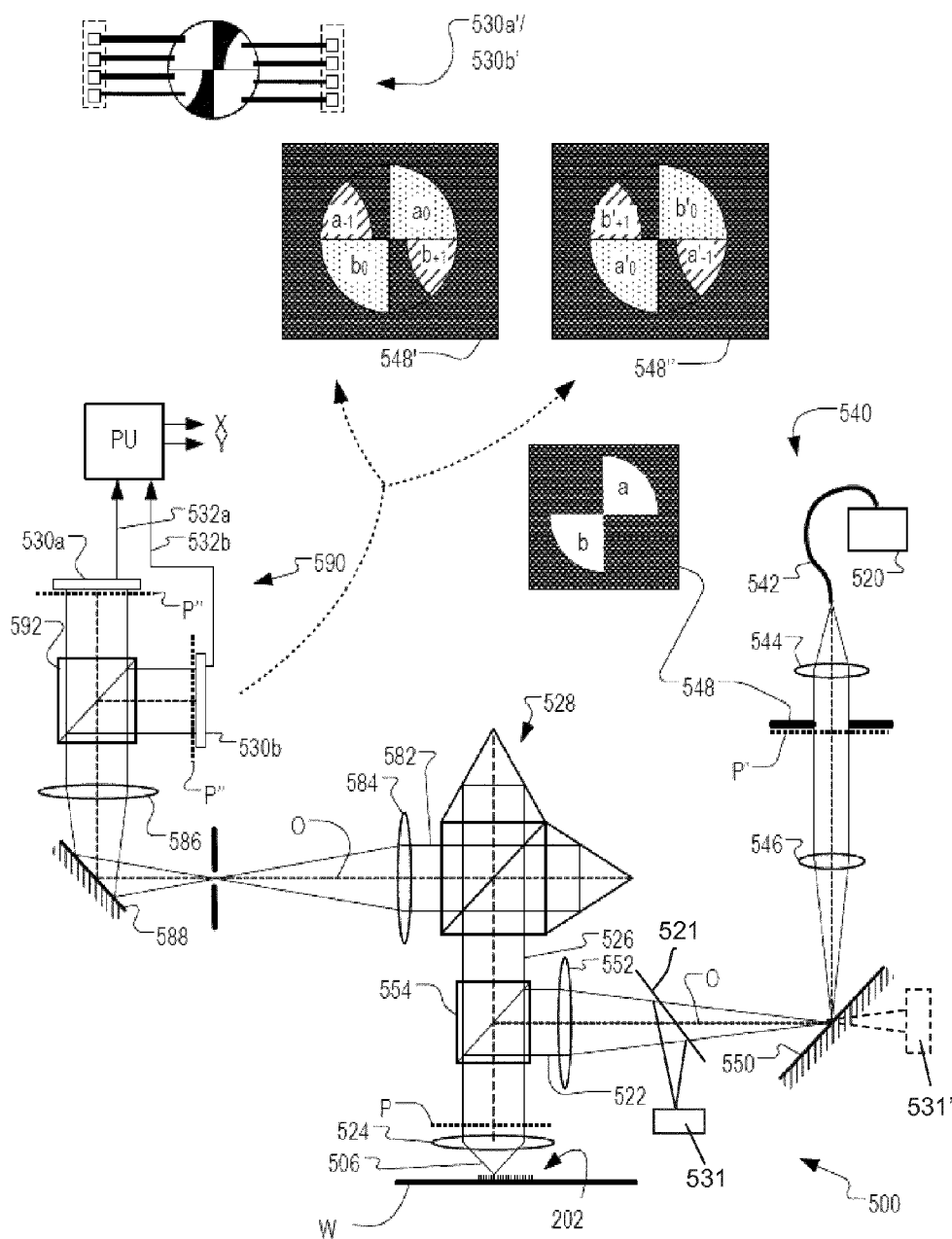
FIG. 7 is a more detailed exemplary schematic diagram showing the optical system of a modified alignment sensor using a segmented illumination profile.

FIG. 7 illustrates an optical system 500 of an alignment sensor according to an embodiment of the invention, which is based on the working principle of the alignment sensor described in the prior publication, U.S. Pat. No. 6,961,116, mentioned above. The alignment sensor according to this embodiment introduces a particular segmented illumination mode which, among other things, allows a reduced pitch of alignment mark for greater accuracy, and which allows scatterometry type measurements to be performed with the alignment sensor, rather than with a separate scatterometer instrument. A further modification can be made based on the disclosure of publication US 2009/195768, also mentioned above, so that simultaneous measurement of X- and Y-position can be performed. For the purpose of the present example, it shall be assumed that measurement of position is performed in one direction only.

For ease of comparison with the schematic diagrams of FIGS. 3 and 5, some parts of the optical system 500 are labeled with reference signs similar to those used in FIGS. 3 and 5, but with prefix "5" instead of "2". Thus, we see a light source 520, a beam splitter 521, an illumination beam 522, an objective lens 524, an information carrying beam 526, a self-referencing interferometer 528, detectors 530a and 530b, and a second detection arrangement 531. Signals 532a and 532b from the detectors 530a, 530b are processed by processing unit PU, which is modified as appropriate to implement the novel features described below. An optical axis O which has several branches is indicated by a broken line running throughout the optical system 500. Additional components illustrated in this more detailed schematic diagram are as follows. In an illumination subsystem 540, radiation from source 520 is delivered via an optical fiber 542 to a point where it enters an optical system comprising lenses 544 and 546. Of course, where each lens is illustrated schematically by a single element, a practical embodiment may include groups of elements in practice. Reflective optical elements may also be used. Between lenses 544 and 546, the beam formed by radiation from the source is parallel, and passes through a plane P', which is a back-projection of the pupil plane P of objective lens 524. A fixed or configurable illumination aperture 548 is provided in this plane, to allow specific modes of illumination, such as the symmetric, segmented illumination pattern illustrated in FIG. 7. Two diametrically opposite quadrants, labeled a and b, are bright in this aperture pattern (transparent), while the other two quadrants are dark (opaque). This type of aperture is known in scatterometry apparatus, from the published patent application US 2010/201963. The merits of this modified illumination aperture will be described further below. After diffraction by a fixed mirror 550, passing the beam splitter 521, and collimation by a lens 552, illumination beam 522 is delivered from the illumination subsystem 540 to a beam splitter 554, which separates the illumination beam 522 from the information-carrying beam 526, that travels to and from the substrate W directly through objective 524.

Referring now to the processing of information-carrying beam 526, this passes into the self-referencing interferometer 528 in the same manner as the known alignment sensor of U.S. Pat. No. 6,961,116. Interferometer 528 is shown in a simplified, two-dimensional arrangement, but in fact it comprises a three-dimensional arrangement of prisms and other elements, as described in that prior patent. Similarly, polarizing elements that are part of the interferometer are omitted here, for clarity. The function of self-referencing interferometer 528, as in the known example, is to receive the information-carrying beam 526, to split it into two equal parts, to rotate these parts by 180° relative to one another, and combine these parts again into an outgoing beam 582. Further lenses 584 and 586 together with a fixed deflecting mirror 588, deliver this beam to a detection subsystem 590 comprising a polarizing beam splitter 592 and detectors 530a and 530b.

Beam splitter 592 produces two interference patterns that are in anti-phase with each other. Thus, if the interferometer 528 produces destructive interference at one point on detector 530a, there will be constructive interference at the corresponding point on the detector 530b. By subtracting the signals from the two detectors 530a and 530b, one can reduce the influence of common-mode intensity noise, and so obtain a more accurate output from the alignment sensor as a whole.

Whereas, in the known alignment sensor of FIG. 3, detectors 230 are placed in an image plane corresponding to the plane of substrate W, the detectors 530a and 530b in the modified optical system 500 are positioned in a plane P''', which is conjugate with the pupil plane P of objective 524. Each detector 530a and 530b may be an image sensor, for example a CCD camera sensor. Alternatively, individual point detectors may be deployed instead of image sensors, as shown in the inset detail labeled 530a'/530b'. In either case, the radiation field at plane P''' is not an image of the substrate, but a diffraction spectrum of the mark 202, conjugated with the illumination aperture 548. In this type of detection system, the alignment signals used to obtain positional information of the mark 202 can still be obtained, but additionally the pupil plane images detected by detectors 530a and 530b can be used to analyze additional properties of the mark or other features on substrate W, to perform scatterometry. For example, asymmetry of alignment and/or overlay targets can be analyzed, which facilitates measurement of overlay error between layers, for example.

As described in the unpublished prior application U.S. Ser. No. 13/369,614, a benefit of using the alignment sensor to measure target asymmetry, rather than a separate instrument, is that positioning errors between the alignment sensor and the overlay measurement apparatus are reduced. Another benefit is that information on asymmetry in the marks can be used to improve accuracy in the position measurements made using the sensor. This is because asymmetry can introduce systematic errors in the reported position that can be corrected using knowledge of the asymmetry and a suitable formula.

While the illumination pattern provided by aperture 548 has bright quadrants labeled a and b in FIG. 7, the diffraction pattern resulting from diffraction by the lines of the alignment mark 202 in a given direction is represented by the pattern at 548'. In this pattern, in addition to zero order diffraction signals labeled $a_0$ and $b_0$ there are first order diffraction signals visible, labeled $a_{-1}$, $a_{+1}$, $b_{-1}$ and $b_{+1}$. Because other quadrants of the illumination aperture are dark, and more generally because the illumination pattern has 180° rotational symmetry, the diffraction orders $a_{-1}$ and $b_{+1}$ are "free" meaning that they do not overlap with the zero order or higher order signals from other parts of the illumination aperture. This property of the segmented illumination pattern can be exploited to obtain clear first order signals from a diffraction grating (alignment mark) having a pitch which is half the minimum pitch that could be imaged if a conventional, circularly-symmetric illumination aperture were used. This diffraction pattern 548' and the manner in which it can be exploited for scatterometry, are described in the known application US 2010/201963. In the interferometer 528 of the alignment sensor optical system 500, a 180° rotated copy of the diffraction pattern 548', illustrated and labeled 548'' in FIG. 7, is also formed and mixed with pattern 548'. These patterns will interfere with each other during the scanning of the alignment mark 202, so as to provide the position signal.

The diffracted radiation is divided by the beam splitter 554 into a portion directed back towards the illumination subsystem 540 and a portion transmitted through beam splitter 554 towards the interferometer 528. The principle behind the present invention is to use one of the portions and direct the corresponding diffracted radiation towards a second detection arrangement comprising detectors to detect size and/or position variations in the diffracted radiation and a processing unit to calculate from the detected variations a defocus and/or local tilt of the mark 202.

In FIG. 7, this is implemented by beam splitter 521 which directs diffracted radiation coming from the beam splitter 554 towards the second detection arrangement 531. Alternatively, as indicated by dashed lines, mirror 550 may be partially transparent to direct a portion of the zero order signal to a second detection arrangement 531'. In that case, the partially transparent mirror 550 acts as first optical element configured to direct radiation from the illumination arrangement to the beam splitter 554 which acts as a second optical element, and to direct radiation from the second optical element towards the second detection arrangement 531'. Further, the beam splitter 521 may also be located in between the beam splitter 554 and interferometer 528 similar to the embodiment of FIG. 5. It will be apparent to the skilled person that the beam splitter 521 can be located or implemented in many different locations, including in between the interferometer 528 and the first detection arrangement. It is even possible that the first and second detection arrangement are partially integrated with each other, which means that they use at least one optical component and/or detector in common. However, all embodiments have in common that the alignment sensor comprises an optical arrangement including reflective components to direct radiation after diffraction by the mark to the second detection arrangement, and that the second detection arrangement is configured to detect variations in shape, size, and/or position of the detected radiation output by the optical arrangement and to calculate from the detected variations a defocus and/or local tilt of the mark. The second detection arrangement may therefore comprise a combination of detectors and optical components as required for said function of the second detection arrangement. These optical components may include mirrors, partially transparent mirrors, lenses, beam splitters, etc.

A first feature of the next example to be described is the use of off-axis illumination at a limited range of incidence angles (limited radial extent in the pupil plane). By off-axis illumination, it is meant that source regions of radiation are confined to a peripheral portion of the pupil, that is to say, some distance away from the optical axis. Confining the illumination to an extreme periphery of the pupil reduces the smallest possible pitch of the alignment mark from substantially/NA to substantially/2NA, where $\lambda$ is the wavelength of radiation used, and NA is the numerical aperture of an objective lens of the instrument (e.g. the alignment sensor or more generally the position measuring apparatus). The example to be described also uses a particular distribution of spot mirrors in a beam splitter of the apparatus, which can both provide the desired illumination and direct zero order diffracted radiation to a second detection arrangement for defocus and tilt measurements. A 'universal' illumination profile can be designed that allows for aligning on any of the X, Y and XY marks without changing the illumination mode, although this inevitably brings some compromise in performance and/or some complication in the apparatus. Alternatively, dedicated modes can be designed and made to be selectable for use with the different mark types. Different polarizations of illumination can be selected also.

In all of the profiles to be described, the illumination profile is such as to supply coherent radiation from at least first and second source regions within a pupil of the objective lens. The first and second regions are confined to a peripheral portion of said pupil (in the sense of at least being away from the optical axis). They are each limited in angular extent and are positioned diametrically opposite one another with respect to the optical axis. As will be seen from the examples, the source regions may take the form of very small spots, or may be more extended in form. Further source regions may be provided, in particular third and fourth source regions may be provided rotated at 90° from the first and second regions. The apparatus as a whole need not be limited to providing these particular illumination profiles. It may have other modes of use, both known or yet to be developed, which favor the use of different profiles. An example would be an on-axis illumination profile, for compatibility with other marks and measurement methods.

FIG. 10 illustrates an example of a measurement apparatus having an illumination profile 448. The reader will recognize many elements carried over from the known alignment sensor and from the example of FIG. 7. The same reference numbers are used, but with the prefix '2' or '5' changed to '4'. Thus an illumination subsystem 440 comprises a radiation source 420 and fiber 442. An input beam 422 is delivered via beam splitter 454 to an objective lens 424 having a pupil plane P. Objective lens 424 forms a spot 406 on alignment mark 202 on the wafer W. An information-carrying beam 426 passes through beam splitter 454 to a self-referencing interferometer 428. Interferometer 428 splits the radiation field into two equal parts, rotates these parts by 180° relative to one another, and recombines them into an outgoing beam 482. A lens 484 focuses the entire field onto a detector 630, which is an arrangement similar to the known alignment sensor of FIG. 3. Spatial resolution at detector 630 is not required, although it can be provided, of course for other purposes.

Within beam splitter 454, discrete mirror segments may be formed on its internal interface, in a pattern corresponding to the desired illumination profile 448. In practice, this pattern has to be applied to the interface in a distorted form, so that it appears as shown when viewed from the input and output directions.

When applied, the segmented mirror performs a second function as a reflection surface for a zero order signal of the diffracted radiation. Unlike the spot mirror 223 in the known alignment sensor of FIG. 3, however, each mirror segment cannot serve as its own reflection surface, because the zero order signal is reflected by the target to re-enter the objective lens at an angle 180° opposed to its angle of incidence. However, because the mirror has a pattern with 180° symmetry, each segment of mirror can serve as a reflection surface reflecting the zero order signal for the diametrically opposite segment. In this way, and without any additional components, the zero order signals can be removed from the information-carrying beam 426 before it enters interferometer 428 and reflected towards beam splitter 421' shown in dashed lines, where at least a portion of the zero order signals is directed to a second detection arrangement 431' (shown in dashed lines) for detecting defocus and/or tilt of the substrate W.

Alternatively, the diffracted radiation, possibly including a zero order signal when a partially transparent surface is used in beam splitter 454, can be directed towards a second detection arrangement 431 (shown in solid lines) by an optical element 421 (shown in solid lines), here embodied as a beam splitter, wherein in the second detection arrangement 431 or 431', the zero order signals and/or higher order signals can be used in a similar manner as described in relation to FIGS. 4A, 4B, 6A and 6B to detect defocus and/or tilt of the substrate W.

Figure 8:
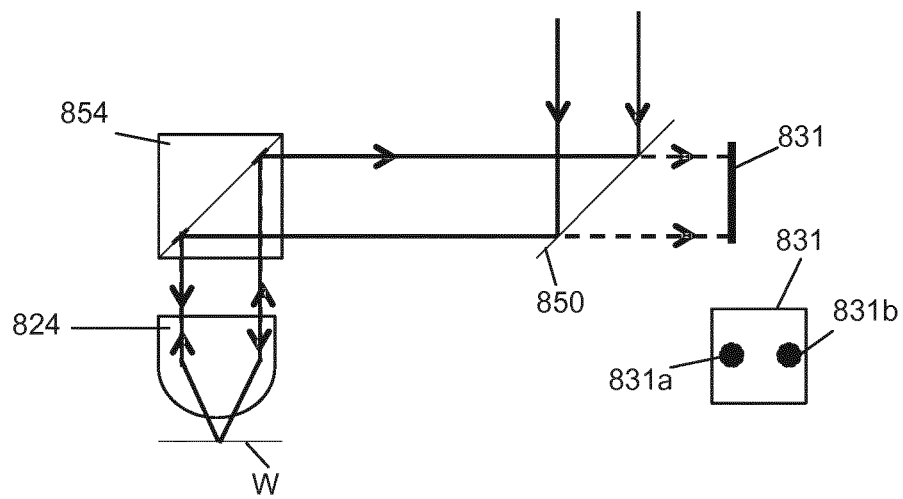
FIG. 8 illustrates a portion of an alignment sensor using an off-axis illumination profile, including an image of the diffracted radiation in case of focus and no tilt.

FIG. 8 depicts a portion of a measurement apparatus having an off-axis illumination profile with two spots. The measurement apparatus according to FIG. 8 uses many elements also described in relation to other embodiment. The same reference numbers are used, but with the prefix changed into '8'.

In FIG. 8, a non-shown illumination arrangement supplies radiation to an objective lens 824 via a mirror 850 and a beam splitter 854. The objective lens 824 forms a spot of radiation on a mark on a substrate W.

Radiation diffracted by the mark is at least partially directed back towards the mirror 850 by the beam splitter 854. The mirror 850 allows the transmission of a portion of the radiation directed towards the mirror after diffraction of the mark, for instance 10% of the total radiation.

The radiation transmitted through the mirror 850 is directed towards a second detection arrangement, here simply embodied as a detector 831.

The substrate in FIG. 8 is in focus of the objective lens 824 and no tilt is present in this example. FIG. 8 further depicts the image of the radiation on the detector 831 in case of using the zero order signal and ignoring the higher order signals. Two spots 831a and 831b are formed on the detector surface, which spots are located on opposite sides of an optical axis of the measurement apparatus.

Figure 9A:
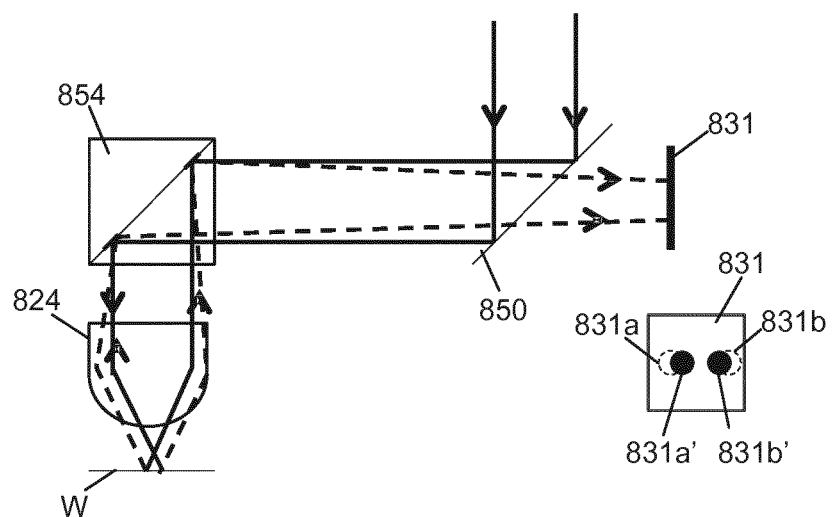
FIGS. 9A, 9B and 9C, illustrates, similar to FIG. 8, a portion of an alignment sensor using an off-axis illumination profiles including images of the diffracted radiation in case of defocus and/or tilt.

FIG. 9A depicts the measurement apparatus of FIG. 8 in case of defocus of the substrate W. Due to the defocus, the spots are imaged differently on the detector 831. The resulting spots are indicated by reference numerals 831a' and 831b'. The spot locations in case of focus and no tilt are also indicated for reference in dashed lines and referred to by reference numerals 831a and 831b. As can be seen, a defocus changes the distance between the two spots, but not the geometrical centre of the two spots.

Figure 9B:
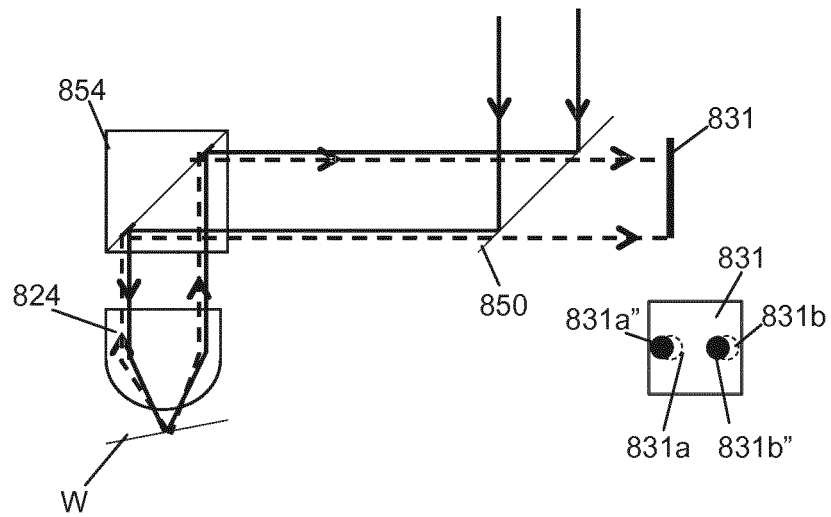

FIG. 9B depicts the measurement apparatus of FIG. 8 in case of tilt of the substrate W. Due to the tilt, the spots are imaged differently on the detector 831. The resulting spots are indicated by reference numerals 831a" and 831b". The spot locations in case of focus and no tilt are also indicated for reference in dashed lines and referred to by reference numerals 831a and 831b. As can be seen, a tilt changes the geometrical centre of the two spots, but not the distance between the two spots.

Figure 9C:
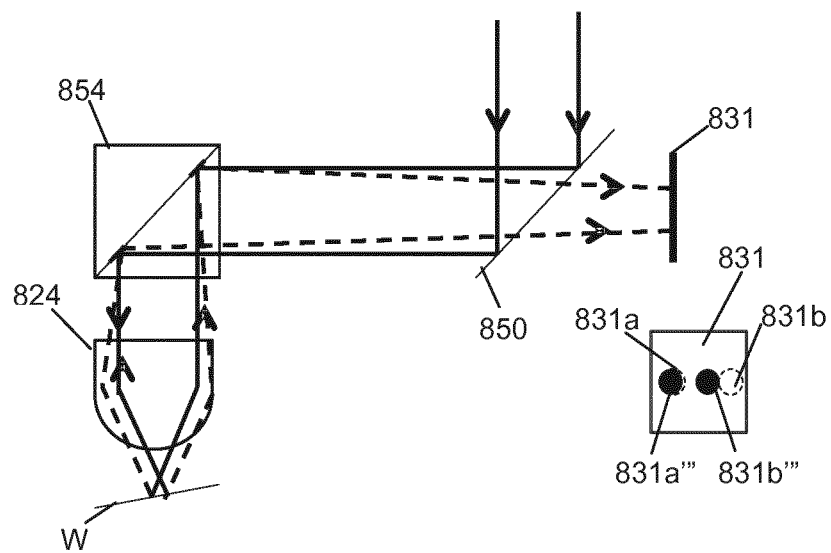

FIG. 9C depicts the measurement apparatus of FIG. 8 in case of defocus and tilt of the substrate W. Due to the tilt and the defocus, the spots are imaged differently on the detector 831. The resulting spots are indicated by reference numerals 831a' and 831b'''. The spot locations in case of focus and no tilt are also indicated for reference in dashed lines and referred to by reference numerals 831a and 831b. As can be seen, the geometrical centre of the two spots and the distance between the two spots have been changed due to the tilt and defocus respectively. The tilt can be determined by determining the change in position of the geometrical centre of the two spots, and the defocus can be determined by determining the change in distance between the two spots.

The difference between on axis and off axis illumination profiles is that the defocus with an on axis illumination profile results in a size variation of the spot, where defocus with an off axis illumination profile results in a position variation of the spot. In some cases, depending on the detectors used, determining the position variation is easier than determining the size variation.

In the same way as the off axis principle of detecting defocus and tilt in relation to FIGS. 8 and 9A-9C shows similarities with the on axis principle of detecting defocus and tilt in relation to FIGS. 3, 4A and 4B, there is also an off axis equivalent of the on axis principle of detecting defocus and tilt in relation to FIGS. 5, 6A and 6B. In the off axis equivalent, the two spots are minimally detectable in case of focus and no tilt, but will become more detectable due to a shift in position of one or both spots due to defocus and tilt. In a similar manner a variation in distance between the two spots is indicative for defocus, and a variation in position of the geometrical centre of the two spots is indicative for tilt.

The position of the spots in FIG. 8, 9A-9C may be detected in an appropriate second detection arrangement using a Position Sensitive Detector (PSD), CCD camera or any similar device. However, it is also possible to detect the position of the spots using a multi-element photodiodes, e.g. a quad-cell using four photodiodes in an array configuration.

FIG. 11 depicts a front view of a quad-cell QC comprising four radiation sensitive surfaces, respectively QC1, QC2, QC3 and QC4 which are arranged in an array, wherein each surface provides an output signal representative for the amount of radiation incident to the surface. When a spot is incident to the quad-cell, the outputs of the radiation sensitive surfaces can be used to determine the position of the spot on the quad-cell. For instance, the position of the spot in Y-direction can be determined by comparing the output of surfaces QC3 and QC4 with the output of surfaces QC1 and QC2. In a similar manner, the output of surfaces QC1 and QC3 and the output of surfaces QC2 and QC3 can be compared to determine the position of the spot in the X direction.

The spot may be directed towards a multi-element photodiodes using optical fibers, wherein a fiber is provided for each radiation sensitive surface. The spot is in that case incident to the optical fibers, wherein each fiber transmits a corresponding portion of the spot to the respective radiation sensitive surface. An advantage of using the optical fibers is that the detector in the form of the multi-element photodiodes can be placed further away from the other portions of the sensor, which may be advantageous from heat point of view. The generation of heat at the detector due to the dissipation of radiation and Joule heating in associated electronics may have less influence on the accuracy of the sensor or any other nearby component.

It is to be noted that for using multi-element photodiodes, the size of the spot and the allowed shift in position of the spot should be in certain ranges in order to be suitable for position determination.

It is further to be noted that for determining the position of a spot in one direction a minimum of two radiation sensitive surfaces are used, and for determining the position of a spot in two directions, at least three radiation sensitive surfaces are favorable. It is possible to detect the position in two directions using two radiation sensitive surfaces only by only allowing a portion of the spot to be incident on the two radiation sensitive surfaces, so that a difference signal between the two radiation sensitive surfaces is representative for the position in one direction, and a sum signal of the two radiation sensitive surfaces is representative for the position in another direction. However, in practice, a quad-cell is most convenient as it allows the determination of the position of a spot in two orthogonal directions while using the sum signal as a normalization to reduce the influence of radiation intensity variations.

The multi-element photodiodes can be used for determining the spot of a zero order signal or any higher order signal. When using the spot of a higher order signal, the position of the multi-element photodiodes may be dedicated for a single pitch or a small range of pitches of the mark only, as the spot position of a higher order signal is dependent on the pitch of the mark. The spot position of a zero order signal is independent of the pitch of the mark.

It should be noted that in the examples shown in FIGS. 7 and 10 above we have omitted out some polarizing elements that are used in practice around the interferometer. This is only done to simplify the explanation of this idea. In a real implementation they will generally be included. Additionally, it is customary to make measurements with different polarizations according to the mark type, and/or to make measurements with more than one polarization on each mark. The features to achieve desired polarizations can readily be envisaged by the skilled person.

It should be understood that the processing unit PU which controls alignment sensor, processes signals detected by it, and calculates from these signals position measurements suitable for use in controlling the lithographic patterning process, will typically involve a computer assembly of some kind, which will not be described in detail. The computer assembly may be a dedicated computer external to the apparatus, it may be a processing unit or units dedicated to the alignment sensor or, alternatively, it may be a central control unit LACU controlling the lithographic apparatus as a whole. The computer assembly may be arranged for loading a computer program product comprising computer executable code. This may enable the computer assembly, when the computer program product is downloaded, to control aforementioned uses of a lithographic apparatus with the alignment sensor AS.

Once, the defocus and/or tilt have been determined using the diffracted radiation, this information can be used in different ways. One of the ways is to correct for the defocus and/or tilt by appropriately positioning the mark, e.g. using a substrate support as described in relation to the apparatus of FIG. 1. As the focus and orientation of the mark have improved due to the correction carried out by the substrate support, the position measurement of the mark is more accurate, i.e. the measured apparent position deviation and color-to-color variations in case of using radiation with two or more specific wavelengths have been reduced. The ability to correct for defocus and/or tilt also allows the use of a higher numerical aperture as the increased sensitivity of the sensor to defocus and/or tilt can be compensated for.

Another way to use the defocus and/or tilt information is to determine a weighing factor based on the defocus and/or tilt information, which weighing factor is representative for the reliability of the measured position of the mark. When fitting a model to the measured position, the weighing factor can be combined with the measured position of the corresponding mark so that less reliable marks have a smaller contribution to the model than more reliable marks, thereby improving the accuracy of the fitted model. The fitted model in turn can be used to estimate the position of other points on the substrate, thereby for instance allowing a second pattern to be transferred to the substrate and be aligned with said other points on the substrate.

The diffracted radiation can also be used to predict mark shape parameters e.g. based on scattering of the radiation by the mark, which mark shape parameters may for instance include depth, layer thickness, $N_k$ values, pitch, critical dimension, side wall angle, etc. The information in the diffracted radiation can thus be used to perform specular spectroscopic scatterometry.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An apparatus comprising:
an objective lens configured to form a spot of radiation on a mark using radiation supplied by an illumination arrangement while scanning the spot of radiation across the mark in a scanning direction;
a radiation processing element configured to process radiation that is diffracted by the mark and received by the objective lens;
a first detection arrangement configured to detect variations in an intensity of radiation output by the radiation processing element during the scanning and to calculate from the detected variations a position of the mark in at least a first direction of measurement;
an optical arrangement configured to direct radiation that is diffracted by the mark to a second detection arrangement; and
the second detection arrangement configured to detect size and position variations in the radiation output by the optical arrangement and to calculate from the detected size and position variations a defocus and a local tilt of the mark.

2. The apparatus according to claim 1, wherein the radiation processing element is a self-referencing interferometer.

3. The apparatus according to claim 1, wherein the optical arrangement comprises a first optical element and a second optical element, wherein the first optical element is configured to direct the radiation from the illumination arrangement to the second optical element and to direct radiation from the second optical element towards the second detection arrangement, and wherein the second optical element is configured to divert the radiation from the first optical element into the objective lens and to direct radiation after diffraction from the mark to the first optical element.

4. The apparatus according to claim 1, wherein the optical arrangement comprises an optical element in between the objective lens and the radiation processing element.

5. The apparatus according to claim 1, wherein the optical arrangement comprises an optical element in between the radiation processing element and the first detection arrangement.

6. The apparatus according to claim 1, wherein the illumination arrangement is configured to supply the radiation with a predetermined illumination profile across a pupil of the apparatus.

7. A method of measuring a position of a mark on a substrate, the method comprising:
illuminating the mark with a spot of radiation via an objective lens and receiving radiation diffracted by the mark via the objective lens;
processing the diffracted radiation in a radiation processing element;
detecting first variations in an intensity of radiation output by the radiation processing element while scanning the mark with the spot of radiation;
calculating from the detected first variations a position of the mark in at least a first direction of measurement,
detecting second variations in size and position of radiation that is diffracted by the mark; and
calculating from the detected second variations a defocus and a local tilt of the mark.

8. The method according to claim 7, wherein detecting the first variations is carried out in a first detection arrangement, and wherein detecting the second variations is carried out in a distinct second detection arrangement.

9. The method according to claim 8, wherein at least a part of the radiation after diffraction returns to a source of the radiation spot, and wherein the returned radiation is directed towards the second detection arrangement in between the objective lens and the source.

10. The method according to claim 8, wherein a part of the diffracted radiation is directed towards the second detection arrangement in between the objective lens and the radiation processing element.

11. The method according to claim 7, further comprising:
determining a weighing factor for the mark based on the measured defocus and tilt, wherein the weighing factor is representative of reliability of the measured position of the mark; and
applying the weighing factor to the measured position of the mark when used in an alignment model fitted to the measured position of multiple marks in order to estimate the position of other points on a substrate.

12. The method according to claim 7, further comprising:
adjusting the position of the mark to correct for the defocus and tilt.

13. The method according to claim 7, wherein the radiation processing element is a self-referencing interferometer.

14. The method according to claim 7, further comprising:
performing scatterometry on the diffracted radiation signal in order to determine mark shape parameters.

15. A lithographic apparatus arranged to transfer a pattern from a patterning device onto a substrate, the apparatus comprising:
a substrate table constructed to hold a substrate; and
an alignment sensor configured to measure positions of marks on the substrate relative to a reference frame of the lithographic apparatus, wherein the alignment sensor comprises a measuring apparatus, the measuring apparatus comprising:
an objective lens configured to form a spot of radiation on a mark using radiation supplied by the illumination arrangement while scanning the spot of radiation across the mark in a scanning direction,
a radiation processing element configured to process radiation that is diffracted by the mark and received by the objective lens,
a first detection arrangement configured to detect variations in an intensity of radiation output by the radiation processing element during the scanning and to calculate from the detected variations a position of the mark in at least a first direction of measurement,
an optical arrangement, and
a second detection arrangement configured to detect size and position variations in the radiation output by the optical arrangement and to calculate from the detected size and position variations a defocus and a local tilt of the mark.

16. A method of manufacturing a device in which a lithographic process is used to transfer a pattern from a patterning device onto a substrate, and wherein the transfer of a pattern onto the substrate is controlled by reference to positions of marks on the substrate measured using a method, the method comprising:
illuminating a mark with a spot of radiation via an objective lens and receiving radiation diffracted by the mark via the objective lens;
processing the diffracted radiation in a radiation processing element;
detecting first variations in an intensity of radiation output by the radiation processing element while scanning the mark with the spot of radiation;
calculating from the detected first variations a position of the mark in at least a first direction of measurement,
detecting second variations in size and position of radiation that is diffracted by the mark; and
calculating from the detected second variations a defocus and a local tilt of the mark.

17. A method of measuring a position of a mark on a substrate, the method comprising:
illuminating the mark with a spot of radiation via an objective lens and receiving radiation diffracted by the mark via the objective lens;
processing the diffracted radiation in a radiation processing element;
detecting first variations in an intensity of radiation output by the radiation processing element while scanning the mark with the spot of radiation;
calculating from the detected first variations a position of the mark in at least a first direction of measurement,
detecting second variations in size and/or position of radiation that is diffracted by the mark;
calculating from the detected second variations a defocus and/or a local tilt of the mark;
determining a weighing factor for the mark based on the measured defocus and/or tilt, wherein the weighing factor is representative of reliability of the measured position of the mark; and
applying the weighing factor to the measured position of the mark when used in an alignment model fitted to the measured position of multiple marks in order to estimate the position of other points on a substrate.

* * * * *